(12) United States Patent
Kim et al.

(10) Patent No.: US 10,340,288 B2
(45) Date of Patent: Jul. 2, 2019

(54) METHOD, APPARATUS, AND SYSTEM FOR IMPROVED MEMORY CELL DESIGN HAVING UNIDIRECTIONAL LAYOUT USING SELF-ALIGNED DOUBLE PATTERNING

(71) Applicant: GLOBALFOUNDRIES INC., Grand Cayman (KY)

(72) Inventors: Juhan Kim, Santa Clara, CA (US); Mahbub Rashed, Cupertino, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 240 days.

(21) Appl. No.: 15/226,867

(22) Filed: Aug. 2, 2016

(65) Prior Publication Data
US 2018/0040631 A1    Feb. 8, 2018

(51) Int. Cl.
| | |
|---|---|
| *H01L 27/118* | (2006.01) |
| *H01L 29/78* | (2006.01) |
| *H01L 27/11* | (2006.01) |
| *H01L 27/02* | (2006.01) |

(52) U.S. Cl.
CPC .... *H01L 27/11807* (2013.01); *H01L 27/0207* (2013.01); *H01L 27/1104* (2013.01); *H01L 29/785* (2013.01); *H01L 2027/11838* (2013.01); *H01L 2027/11875* (2013.01); *H01L 2027/11885* (2013.01)

(58) Field of Classification Search
CPC .................................. H01L 27/11807
USPC .......................................... 257/206
See application file for complete search history.

(56) References Cited

U.S. PATENT DOCUMENTS

| | | | | |
|---|---|---|---|---|
| 6,016,390 | A * | 1/2000 | Mali | G11C 7/18 257/E27.099 |
| 6,704,918 | B1 * | 3/2004 | Ali | G06F 17/5077 716/129 |
| 8,791,577 | B2 | 7/2014 | Kim et al. | |
| 8,839,168 | B2 | 9/2014 | Kye et al. | |
| 2008/0241969 | A1 * | 10/2008 | Winkler | G03F 7/70525 438/5 |
| 2016/0064067 | A1 * | 3/2016 | Mojumder | G11C 11/40 365/154 |
| 2016/0293478 | A1 * | 10/2016 | Yuan | H01L 21/76802 |
| 2016/0336183 | A1 * | 11/2016 | Yuan | H01L 29/66795 |

* cited by examiner

*Primary Examiner* — Ajay Arora
(74) *Attorney, Agent, or Firm* — Williams Morgan, P.C.

(57) ABSTRACT

At least one method, apparatus and system disclosed involves an integrated circuit comprising a unidirectional metal layout. A first set of metal features are formed in a vertical configuration in a first metal layer of a memory cell. A second set of metal features are formed in a unidirectional horizontal configuration in a second metal layer of the memory cell. A third set of metal features are formed in the unidirectional horizontal configuration in a second metal layer of a functional cell for providing routing compatibility between the memory cell and the functional cell. The memory cell is placed adjacent to the functional cell for forming an integrated circuit device.

16 Claims, 13 Drawing Sheets

METHOD, APPARATUS, AND SYSTEM FOR IMPROVED MEMORY CELL DESIGN HAVING UNIDIRECTIONAL LAYOUT USING SELF-ALIGNED DOUBLE PATTERNING

BACKGROUND OF THE INVENTION

Field of the Invention

Generally, the present disclosure relates to the manufacture of sophisticated semiconductor devices, and, more specifically, to various methods and structures, including unidirectional metal layout for memory cell, for using improved cell routability for metal lines for manufacturing integrated circuits.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

FIG. 1 illustrates a stylized cross-sectional depiction of a state-of-the-art finFET device. A finFET device 100 illustrated in FIG. 1 comprises a plurality of "fins" 110. The semiconductor device may be position to a vertical orientation, creating one or more fins 110. The source and drain of the finFET are placed horizontally along the fin. A high-k metal gate 120 wraps over the fin, covering it on three sides. The gate 120 defines the length of the finFET device. The current flow occurs along an orthogonal crystal plane in a direction parallel to the plane of the semiconductor wafer. The electrically significant height of the fin (labeled H) is typically determined by the amount of oxide recess in the fin reveal step and hence is constant for all fins 110.

The thickness of the fin (labeled $T_{fi}$) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a better packing of the devices per square area resulting in a denser design, or more efficient use of silicon wafer area.

The scaling down of integrated circuits coupled with higher performance requirements for these circuits have prompted an increased interest in finFETs. FinFETs generally have the increased channel widths, which includes channel portions formed on the sidewalls and top portions of the fins. Since drive currents of the finFETs are proportional to the channel widths, finFETs generally display increase drive current capabilities.

Designers often use pre-designed basic cells to form layouts of more complex cells comprising finFET devices. For example, designers often use a unit SRAM cell to design and fabricate a memory device. In a CMOS integrated circuit, PMOS and NMOS transistor pairing are often used to form circuit cells.

The ultimate goal in integrated circuit fabrication is to accurately reproduce the original circuit design on integrated circuit products. Historically, the feature sizes and pitches employed in integrated circuit products were such that a desired pattern could be formed using a single patterned photoresist masking layer. However, in recent years, device dimensions and pitches have been reduced to the point where existing photolithography tools, e.g., 193 nm wavelength immersion photolithography tools, cannot form a single patterned mask layer with all of the features of the overall target pattern. Accordingly, device designers have resorted to techniques that involve performing multiple exposures to define a single target pattern in a layer of material. One such technique is generally referred to as multiple patterning, e.g., double patterning. Generally speaking, double patterning is an exposure method that involves splitting (i.e., dividing or separating) a dense overall target circuit pattern into two separate, less-dense patterns. This technique effectively lowers the complexity of the photolithography process, improving the achievable resolution and enabling the printing of far smaller features than would otherwise be impossible using existing photolithography tools.

The Self-Aligned-Double-Patterning (SADP) process is one such multiple patterning technique. The SADP process may be an attractive solution for manufacturing next-generation devices, particularly metal routing lines on such next-generation devices, due to better overlay control that is possible when using an SADP process. In SADP processes, metal features that are defined by mandrel patterns are referred to as "mandrel metal," while metal feature that are not defined by mandrel patterns are called "non-mandrel metal." Further, SADP processes generally have a high tolerance for overlay errors. Therefore, SADP processes have been increasingly adopted for metal formation in higher resolution designs, such as 14 nm and 10 nm designs.

To use double patterning techniques, an overall target pattern must be what is referred to as double-patterning-compliant. In general, this means that an overall target pattern is capable of being decomposed into two separate patterns that each may be printed in a single layer using existing photolithography tools. Layout designers sometime speak of such patterns with reference to "colors," wherein the first mask will be represented in an EDA tool using a first color and the second mask will be represented in the EDA tool using a second, different color. To the extent a layout is non-double-patterning-complaint, it is sometimes stated to present a "coloring conflict" between the two masks.

In order to accommodate smaller integrated circuit designs, designers have provided more dense, smaller-track functional cells (e.g., 10-track or lower functional cells). For larger track designs, generally, designers desire to have a unidirectional metal-1 (M1) design where M1 is parallel to the gate (PC) structures, while allocating metal-2 (M2) as power rail. However, with smaller-track designs, in order to complete routing, designers are forced to make M1 bi-directional.

When designing a layout of various devices with an integrated circuits (e.g., CMOS logic architecture), designers often select pre-designed functional or standard cells comprising various features (e.g., diffusion regions, transistors, metal lines, vias, etc.) and place them strategically to provide an active area of an integrated circuit. One challenge of designing a layout is accommodating ever-increasing density of cell components and still maintain routability for connecting various components of the cells. This is increasingly a challenge as dimensions of these components get smaller, such as for 10 nm or lower integrated circuit designs.

Designers often formulate memory cell layout and couple them with pre-designed functional or standard cells. In some cases, the use of these functional cells requires that some of the metal features in memory cell layouts to be of certain directions. In order to reduce spacing between structures of different colors and to avoid "same color" conflicts, the memory cells also include triple metal-1 (M1) structures with bi-directional shapes.

Turning now to FIGS. 2A-2C, stylized depictions metal and contact/gate layers of a single patterned prior art memory cell is illustrated. FIGS. 2A-2C show the formation of a memory bit cell 200 layout using single patterned M1 and M2 structures. The memory cell 200 comprises a cell boundary 210. FIG. 2A shows an M2 layer on which a plurality of M2 structures are formed. A $1^{st}$ M2 ground structure 201a and a $2^{nd}$ M2 ground structure 201b are formed coupling a memory cell 200 to a ground signal. A Vdd M2 structure 202 is formed for coupled the cell 200 to a Vdd signal. Further, a power line M2 structure 205 is formed. A positive bit line 204 and a negative bit line 206 are formed using M2 structures.

FIG. 2B shows M1 structures that are formed for creating the memory cell 200. A plurality of horizontal M1 structures 215 are formed. Further, a plurality of contacts 217 are formed for coupling various M1 structures 215 to structures of other layers, e.g., M2 structures.

FIG. 2C shows the formations of contact formation, gate formations, and active layers. The memory cell 200 may comprise a $1^{st}$ active region 221a, a $2^{nd}$ active region 221b, a $3^{rd}$ active region 221c, and a $4^{th}$ active region 221d (collectively "221"). A plurality of gate formations 223, formed from poly-silicon materials may be formed on the active regions 221, and/or may span one or more active regions 221. A plurality of local contacts 217 (e.g., TS, CA, CB contacts) may be formed for coupling various structures of the cell 200.

One problem associated with the memory bit cell layout of FIGS. 2A-2C is that patterned metal layer structures are formed in larger node cells, such as 28 nm node cells. For these types of cells, the M2 metal structures are formed in a bi-directional configuration. However, bi-directional shapes cannot be used as bit line patterns in 10 nm or smaller node cells for configuring SADP patterning. Generally, SADP patterning requires unidirectional shapes.

Designers have attempted to address some of these problems by using triple patterned metal layer structures. FIGS. 3A-3D stylized depictions metal and contact/gate layers of a triple-patterned, prior art memory cell.

FIG. 3A illustrates a cell boundary 310 of a memory cell 300. A plurality of M2 metal structures 302 are formed on an M2 metal layer. Further, a plurality of vias 303 may be formed for connecting various M2 structures to metal structures in other layers. The M2 structures are formed in a unidirectional, horizontal configuration. In some cases, the minimum spacing between the M2 metal structures 302 can be difficult to maintain in smaller, 14 nm or 10 nm node devices.

FIG. 3B shows an M1 layer of the memory cell 300. A plurality of M1 structures that are generally in a horizontal configuration, are formed. A plurality of M1 structures 313 may be formed at the top portion of the cell border 310. One or more of the M1 structures 313 may be configured for providing VDD connections. One or more vias 315 that may be used to couple the M1 structures 312 to other metal layers.

A plurality of M1 structures 314 may be formed at the bottom portion of the cell border 310. One or more of the M1 structures 314 may be configured for providing VSS connections. One or more vias 316 that may be used to couple the M1 structures 314 to other metal layers.

FIG. 3B also shows that a plurality of M1 structures 313 may be formed in the active regions of the memory cell 300. One or more of the M1 structures 313 may be configured for providing portions of a circuit in active regions of the memory cell 300. One or more vias 317 that may be used to couple the M1 structures 313 of the active regions to other metal layers.

FIG. 3C shows the formations of contact formations and gate formations. A plurality of gate formations 321 may be formed in the cell 300. A plurality of gate cuts 322 provide for forming the gate formations 321. A plurality of M2 structures 323 is shown in FIG. 3C. The gate formations 321 may be electrically coupled to M2 structures 323 using local interconnect structures, such as CA/CB structures 325.

FIG. 3D shows active regions of the memory cell 300. A $1^{st}$ active region 242a, a $2^{nd}$ active region 342b, and a $3^{rd}$ active region 342c may be formed in the cell 300. FIG. 3D also shows a plurality of gate formations 321. Further, a plurality of source/drain fins 345 are also shown in FIG. 3D.

As described above, the triple-patterned memory cell 300 utilizes unidirectional M2 layer structures. One problem associated with this memory cell 300 design is that the standard cell layouts that comprise M2 metal structures with perpendicular shaped poly gate layer structures are not compatible with the unidirectional M2 structures of the memory cell 300. Generally, in 10 nm and smaller node standard cells, the M2 layers with perpendicular shapes (as compared to FIG. 2A), are incompatible with the memory cell design of FIGS. 3A-3D. Therefore, the prior art memory cell designs described in FIGS. 2 and 3 may not be compatible with standard cells of 10 nm or smaller nodes. This creates various problems when designing circuits with memory cells and standard functional cells. Accordingly, as described above, there are various inefficiencies, errors, and other problems associated with the state-of-art.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for providing an integrated circuit comprising a unidirectional metal layout. A first set of metal features are formed in a vertical configuration in a first metal layer of a memory cell. A second set of metal features are formed in a unidirectional horizontal configuration in a second metal layer of the memory cell. A third set of metal features are formed in the unidirectional horizontal configuration in a second metal layer of a functional cell for providing routing compatibility between the memory cell and the functional cell. The memory cell is placed adjacent to the functional cell for forming an integrated circuit device.

BRIEF DESCRIPTION OF THE DRAWINGS

The disclosure may be understood by reference to the following description taken in conjunction with the accompanying drawings, in which like reference numerals identify like elements, and in which.

Figure 1:
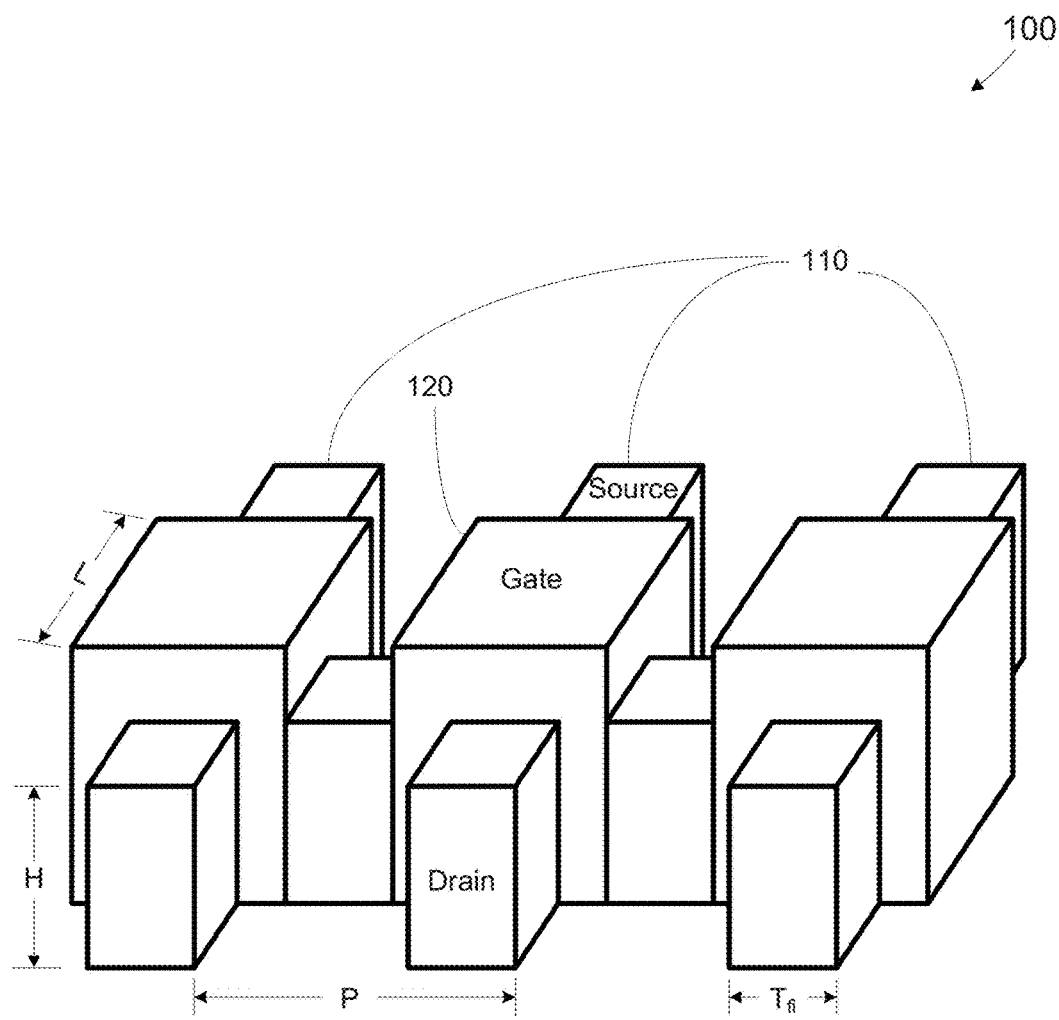
FIG. 1 illustrates a stylized depiction of a cell that comprises a plurality of gate formations.
Figure 2A:
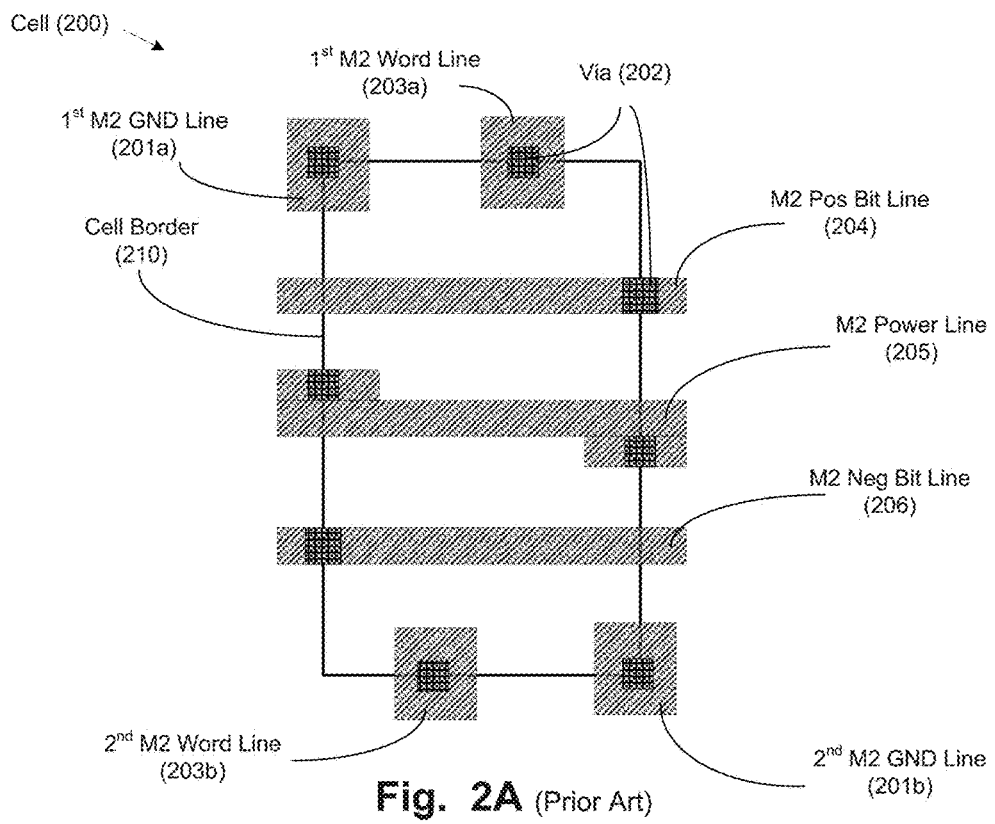
FIG. 2A illustrates a stylized depiction of a single patterned prior art memory cell.
Figure 2B:
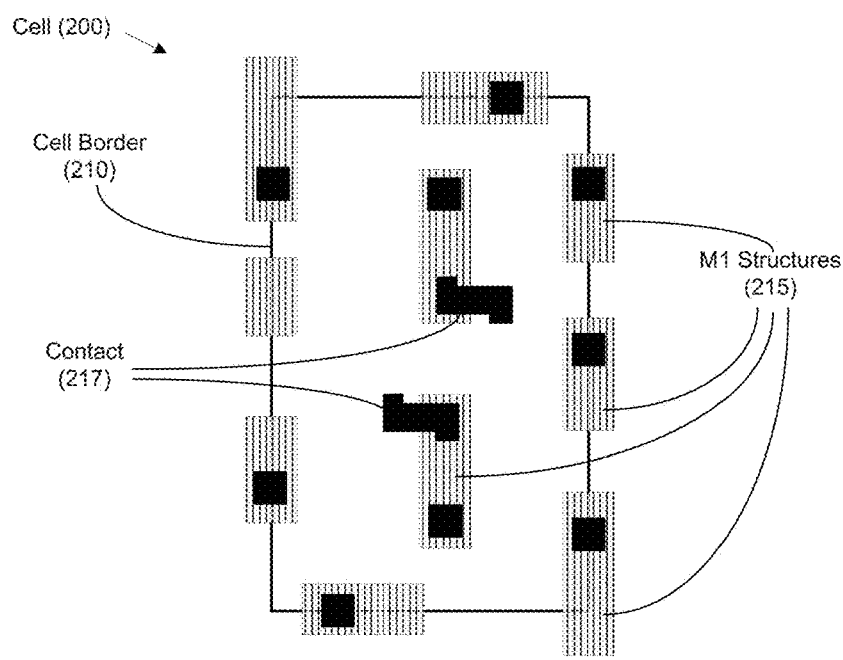
FIG. 2B illustrates a second stylized depiction of the single patterned prior art memory cell.
Figure 2C:
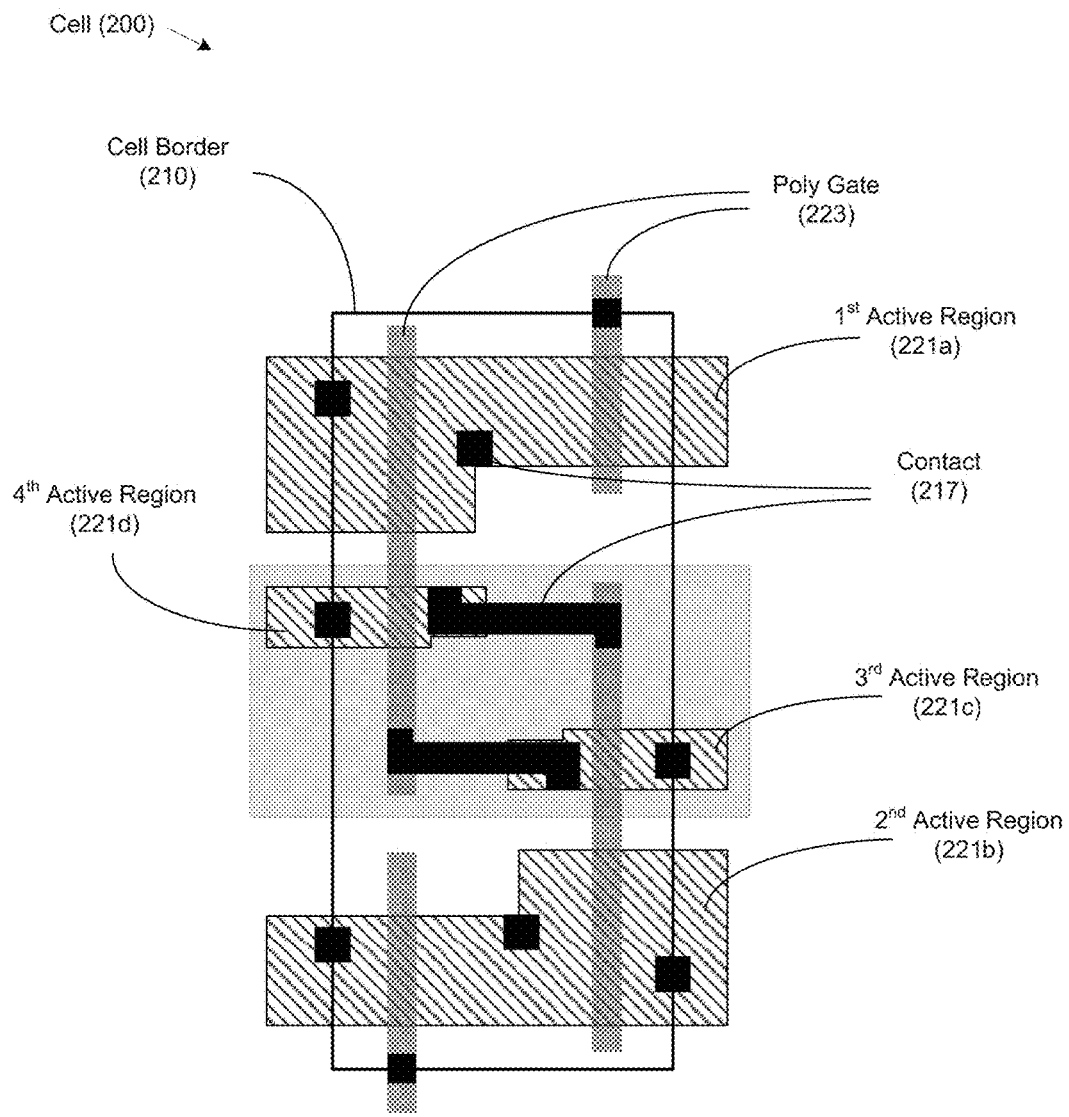
FIG. 2C illustrates a third stylized depiction of the single patterned prior art memory cell.
Figure 3A:
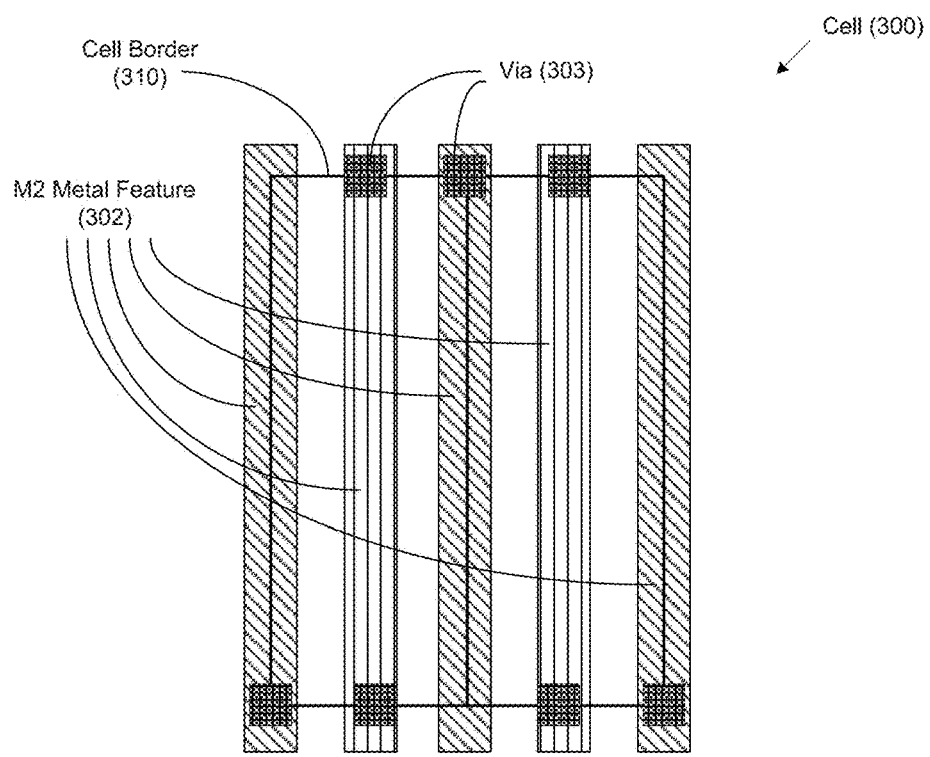
FIG. 3A illustrates a stylized depiction of a triple-patterned, prior art memory cell.
Figure 3B:
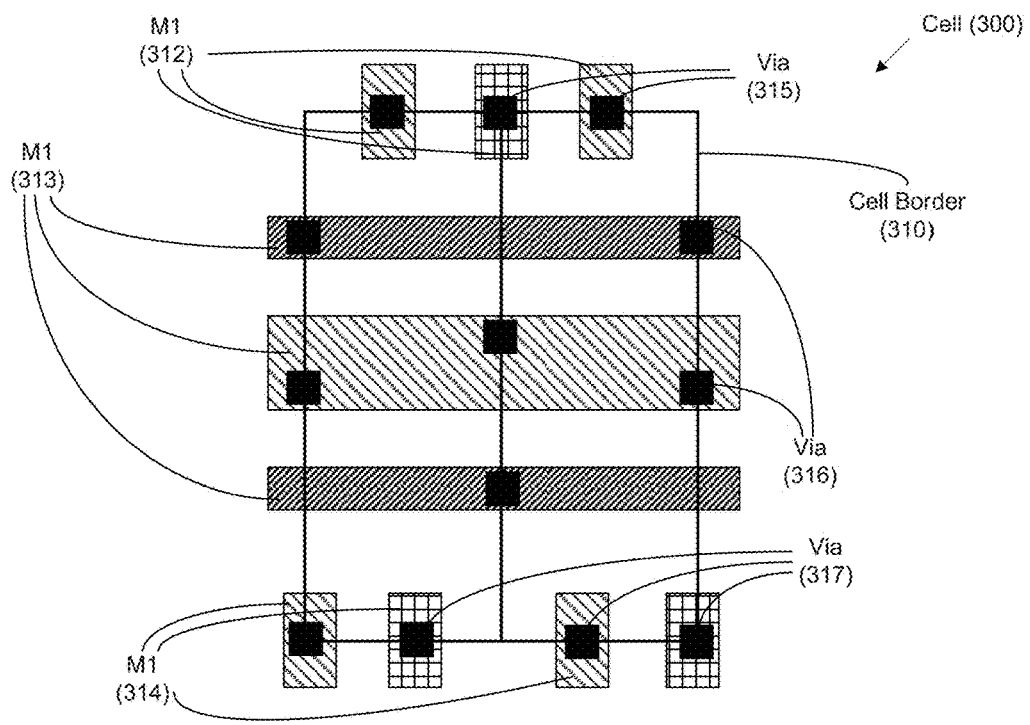
FIG. 3B illustrates a second stylized depiction of the triple-patterned, prior art memory cell.
Figure 3C:
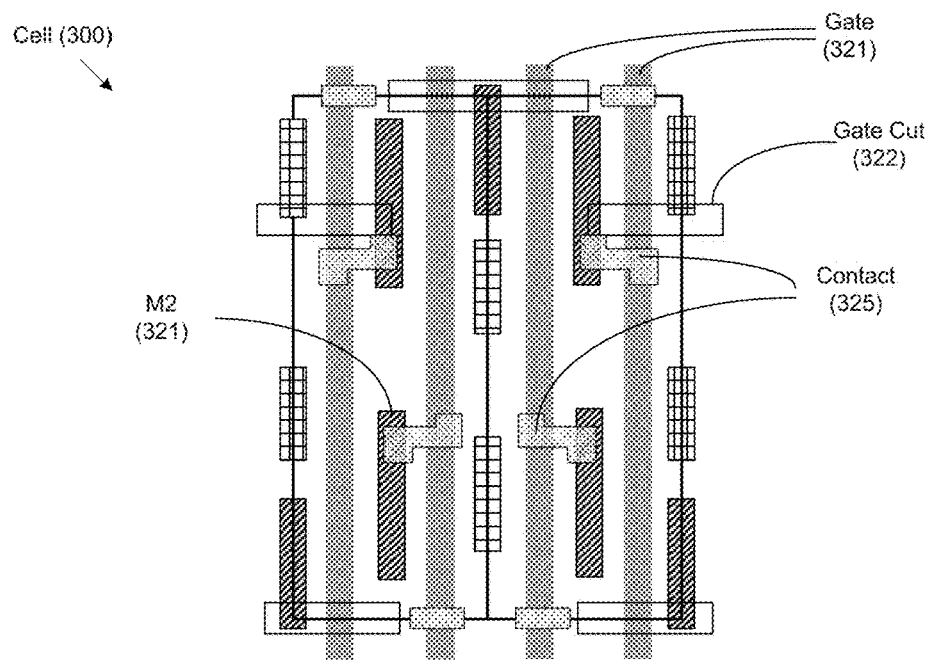
FIG. 3C illustrates a third stylized depiction of the triple-patterned, prior art memory cell.
Figure 3D:
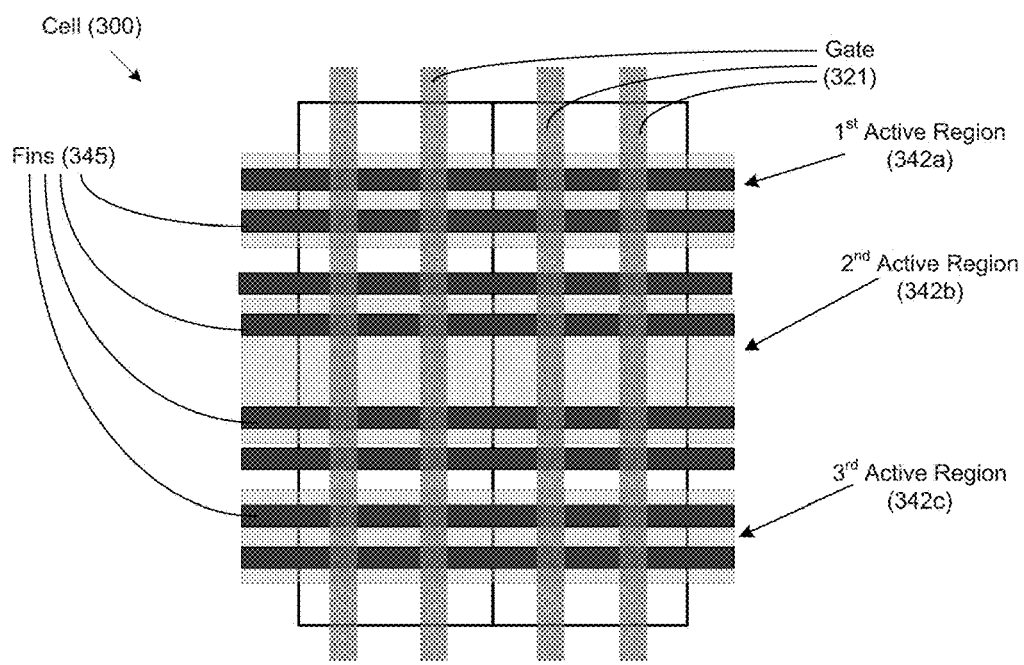
FIG. 3D illustrates a fourth stylized depiction of the triple-patterned, prior art memory cell.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for an integrated circuit design wherein the design comprises metal layer structures that are configured to be compatible with standard functional cells. For example, some embodiments herein provide for a layout-architecture for configuring metal layer structures in a circuit, e.g., a memory cell, such that the configuration of the metal structures are compatible with a standard cell. Exemplary embodiments herein may include providing metal layer structures (e.g., M2 structures) that generally have a unidirectional configuration in order to match corresponding metal structures in a standard functional cell. Other metal layer structures are also generally perpendicular to poly gate layer structures in the standard cell. The term "standard cell" as used herein may represent one or more of a plurality of pre-formed cells that conform to predetermined design rules. Standard cells may be may be one or a plurality of pre-formed devices, such as a flip flop, an AND gate, a NAND gate, an OR gate, a NOR gate, an XOR gate, an inverter device, an AND-OR-INVERT (AOI) device, a buffer device, or the like.

Generally, memory cells include features that are formed using SADP techniques for configuring bit lines and word lines. Typically, bit lines are formed using metal-2 (M2) structures with unidirectional, rectangular shaped features, which may be designed to match and become compatible with similar M2 layers structures of standard cells.

Embodiments herein provide for a memory bit cell (e.g., SRAM bit cell) comprising a plurality of metal layer structures (e.g., M2 metal structures) that are similar to unidirectional shaped metal structures of a standard cell. In some embodiments, these metal structures may be used as bit lines for the memory bit cell, while serving as horizontal routing lines for providing connections for standard cells. Further, in some embodiments, these metal structures may be formed in a perpendicular configuration relative to poly-silicon gates (poly gates) of a standard cell.

In some embodiments, the metal layer structures are formed using SADP patterning. This patterning method may be used to form metal patterns in a predetermined direction, while one or more cut masks are used to remove excess or unnecessary portions of the metal layer structures. The predetermined direction of the metal patterns may be based on forming metal patterns using SAPD patterning such that the metal lines are used as bit lines in a memory bit cell, while the metal lines may be also used as routing lines for a standard cell. In this case, the metal lines may be formed in a perpendicular configuration relative to the configuration of poly gate features of standard cells. Embodiments herein may be performed for 10 nm node technology, 7 nm node technology, and/or for smaller-node technology.

Figure 4A:
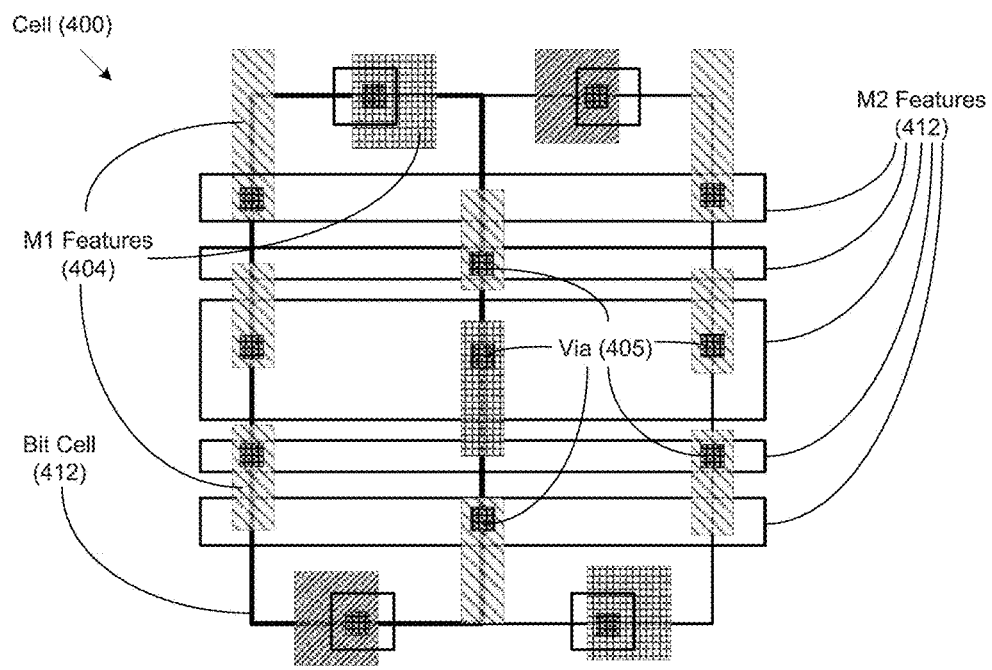
FIG. 4A illustrates a stylized depiction of a memory bit cell layout in accordance with embodiments herein.
Figure 4B:
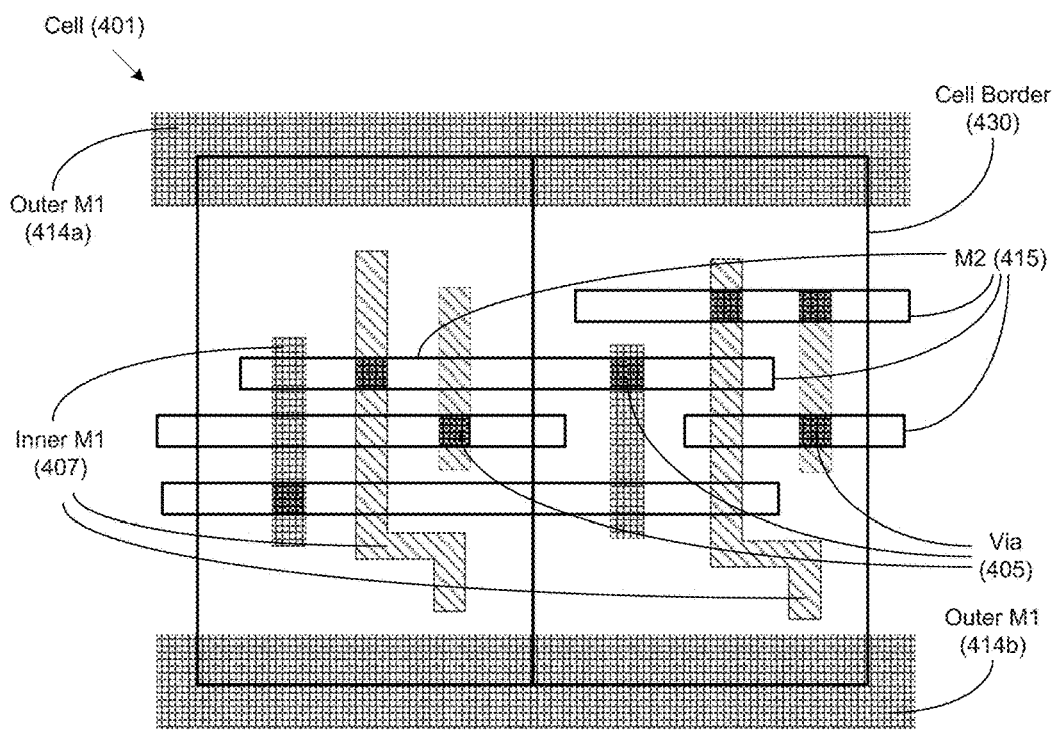
FIG. 4B illustrates a stylized depiction of standard cell that is compatible with the cell layout of FIG. 4A, in accordance with embodiments herein.

Turning now to FIGS. 4A and 4B simultaneously, FIG. 4A illustrates a stylized depiction of a memory bit cell layout in accordance with embodiments herein, while FIG. 4B illustrates a stylized depiction of standard cell that is compatible with the cell layout of FIG. 4A, in accordance with embodiments herein.

FIG. 4A illustrates a memory cell 400. Within the memory cell 400, a bit cell portion 412 may be defined. In one embodiment, the memory cell 400 is an SRAM memory cell. A plurality of M1 metal features ("M1 features") 404 may be formed in the cell 400. In one embodiment, M1 features 404 may be formed along the cell border 410. In some embodiments, the M1 features 404 may extend in a first lateral direction, by which is meant that the M1 features 404 have a greater extent in one lateral direction than the perpendicular lateral direction. For example, in the view shown in FIG. 4A, the M1 features 404 may be considered to be formed in a vertical configuration, wherein "vertical" refers to the orientation of the M1 features 404 in the plane of the drawing page. The Vss and Vdd signals of the memory cell 400 may be electrically coupled to the M1 features 404. Other metal structures in other metal layers, or electrical signals from other layers, may be electrically coupled to M1 features 404 using one or more vias 405. In one embodiment, the M1 features 404 may be formed using a litho-etch-litho-etch-litho-etch (LELELE) process A plurality of M2 metal structures ("M2 features") 412 may also be formed in the memory cell 400. In some embodiments, the M2 features 412 may extend in a second lateral direction perpendicular to the first lateral direction. In other words, in the view shown in FIG. 4A, the M2 features 412 may be considered to be formed in a horizontal configuration, wherein "horizontal" refers to the orientation of the M2 features 412 in the plane of the drawing page. One or more of the M2 features 412 may be coupled to the M1 features 404 using the vias 405.

In one embodiment, the M2 features 412 in the memory cell 400 are formed in a unidirectional configuration. For example, the M2 features 412 in the memory cell 400 may be all formed in a horizontal configuration. This configuration may be relatively perpendicular to other formations (e.g., poly gate formations) used to form an integrated circuit. In one embodiment, the unidirectional M2 features 412 may be formed using SADP technology. In one embodiment, the M2 features 412 may be used as bit lines of bit cell. In one embodiment, the M2 features 412 may be formed using an SAPD process The unidirectional M2 features 412 may be formed such that it is compatible with other M2 metal structures in other portions of the integrated circuit, e.g., in standard cells that are placed adjacent to the memory cell 400. For example, the unidirectional M2 features 412 of the memory cell 400 are formed to be compatible with standard functional cells, e.g., a standard cell 401 of FIG. 4B.

FIG. 4B illustrates an exemplary standard cell 401 that may be implemented in a layout of an integrated circuit (e.g., a memory device) along with the memory cell 400 of FIG. 4A. The standard cell 401 may be defined by a cell border 430. The standard cell 401 may comprise a $1^{st}$ outer M1 metal structure ("outer M1") 414a and a $2^{nd}$ outer M1 metal structure ("outer M1") 414b. In one embodiment, the outer M1 414a may be coupled to a Vdd signal, while the outer M1 414b may be coupled to a Vss signal. The outer M1s 414a and 414b may be formed as horizontal structures for providing power and ground signals. In one embodiment, the outer M1s 414a and 414b may be formed using a litho-etch-litho-etch-litho-etch (LELELE) process.

Further, the standard cell 401 may also comprise a plurality of inner M1 metal structures ("inner M1") 407. The standard cell 401 may also comprise a plurality of M2 metal features ("M2") 415. A plurality of vias may be formed for electrically coupling the outer M1s 414a, 414b to the M2s 415.

The inner M1s 407 may be formed generally in a vertical configuration, consistent with the M1 features 404 of the memory cell 400 of FIG. 4A. The M2s 415 may be formed generally in a horizontal configuration, consistent with the M2 features 412 of the memory cell 400. In this manner, the memory cell 400 is more compatible with the unidirectional metal features of the standard cell 401.

The designs of the memory cell 400 and the standard cell 400 provide for a unidirectional-metal architecture. The M2 features 412 of the memory cell 400 are configured in the same unidirectional format as the M2s 415 of the standard cell 401. Therefore, the M2 features 412 of the memory cell 400 may be used as bit lines, while the M2s 415 may be being used as horizontal routing lines for the standard cell, thus making the cells 400, 401 more printable and better conducive for fabrication in small-node (e.g., 10 nm or smaller nodes) technology. In one embodiment, the M2s 415 may be formed using an SAPD process.

Figure 5A:
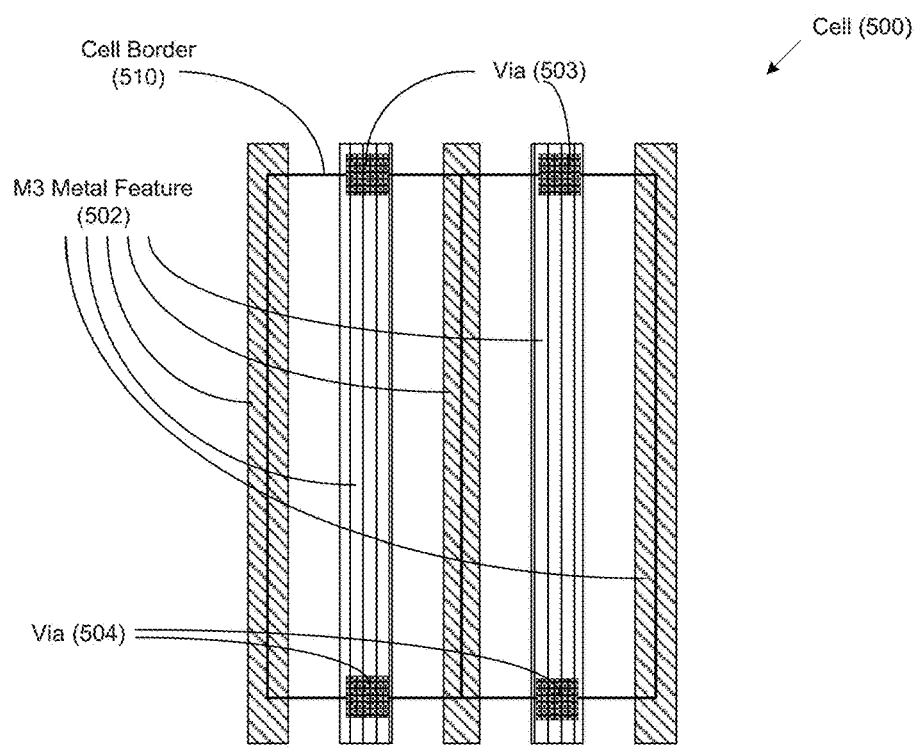
FIG. 5A illustrates a stylized depiction of a Metal-3 (M3) layer of a cell of a semiconductor device, in accordance with embodiments herein.

Turning now to FIGS. 5A-5D, a stylized depiction of a plurality of layers of a cell of semiconductor device, in accordance with embodiments herein is illustrated. FIG. 5A illustrates a stylized depiction of a Metal-3 (M3) layer of a semiconductor device, in accordance with embodiments herein. FIG. 5A illustrates a stylized depiction of a memory cell layout 500, in accordance with some embodiments herein. The cell 500 may be defined by a cell boundary 510. The cell 500 may comprise a plurality of metal-3 (M3) layer metal features 502. A plurality of vias 503 may be placed in predetermined locations on the metal features 502 for providing electrical connections to metal features on other layers. In one embodiment, the M3 metal features may be formed in a unidirectional, vertical configuration.

Figure 5B:
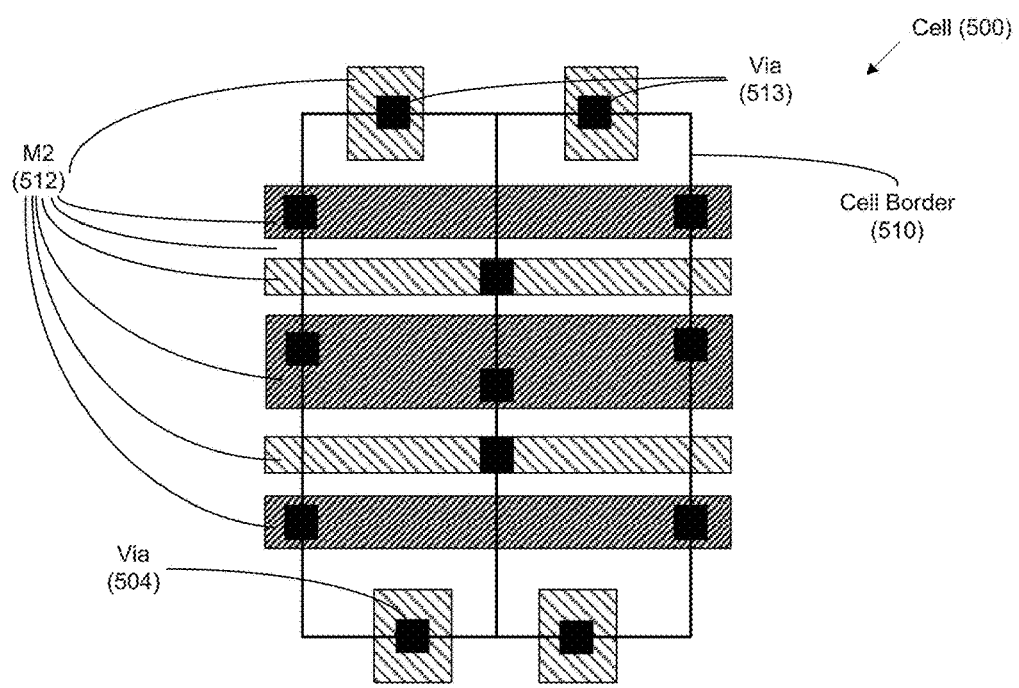
FIG. 5B illustrates a stylized depiction of an M2 layer of the cell of FIG. 5A, in accordance with embodiments herein.

FIG. 5B illustrates a stylized depiction of an M2 layer of the cell 500, in accordance with embodiments herein. The cell 500 may comprise a plurality of M2 layer metal features 512. A plurality of vias 504 may be placed in predetermined locations on the metal features 512 for providing electrical connections to metal features on other layers. In one embodiment, the M2 metal features may be formed in a unidirectional, horizontal configuration. In one embodiment, the M2 metal lines 512 may be used as bit lines in the case that the cell 500 is a bit cell. In other embodiments, the M2 metal lines 512 may be used as routing lines in the case that the cell 500 is a standard cell. In one embodiment, the M2 metal structures 512 may be formed using an SAPD process.

Figure 5C:
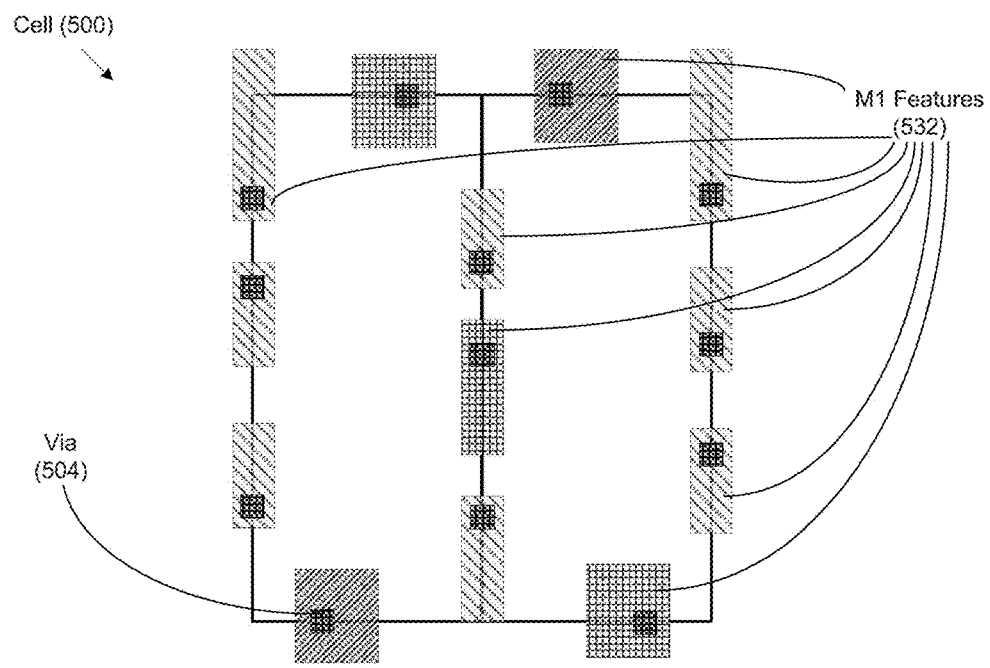
FIG. 5C illustrates a stylized depiction of an M1 layer of the cell of FIG. 5A, in accordance with embodiments herein.

Turning now to FIG. 5C, a stylized depiction of an M1 layer of the cell 500, in accordance with embodiments herein is illustrated. A plurality of M1 metal structures 532 may be formed. In one embodiment, the M1 metal structures 532 may be formed along the cell border 510. In some embodiments, the M1 metal structures 532 may be formed in a vertical configuration. The Vss and Vdd signals of the cell 500 may be electrically coupled to the M1 metal structures. Other metal structures in other metal layers, or electrical signals from other layers, may be electrically coupled to M1 metal structures 532 using one or more vias 504. In one embodiment, the M1 metal structures 532 may be formed using a litho-etch-litho-etch-litho-etch (LELELE) process.

Figure 5D:
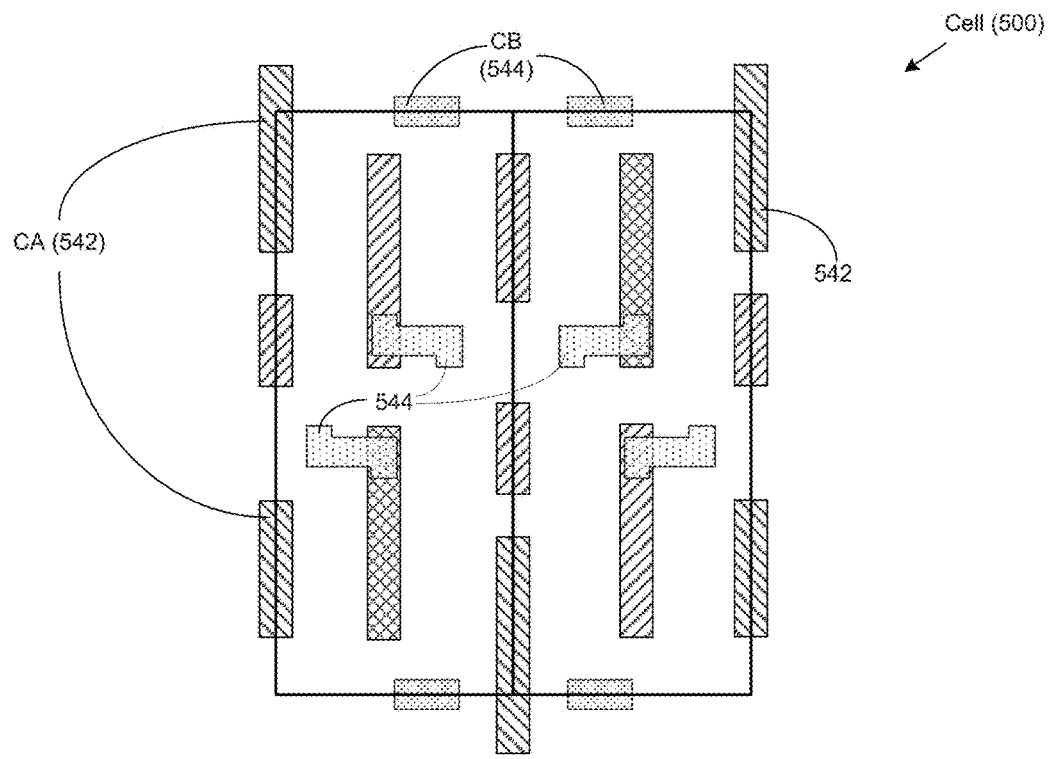
FIG. 5D illustrates a stylized depiction of an intermediate contact layer of the cell of FIG. 5A, in accordance with embodiments herein.

FIG. 5D illustrates a stylized depiction of an intermediate contact layer of the cell 500, in accordance with embodiments herein. Embodiments herein provide for using middle-of-line (MOL) structures, such as local interconnect formations CA and CB features in order to provide connections/routing to enable use of unidirectional metal formations. The cell 500 may comprise a plurality of CA features 542 formed along the cell border 510 and/or the inner portion of the cell border 510. In one embodiment, the CA features 542 may be formed generally in a vertical configuration. The cell 500 may also comprise a plurality of trench silicide (TS) features.

A plurality of CB features 544 may also be formed in the cell 500. Some of the CB features 544 may be formed in connection with one or more CA features 542. In one embodiment, the CB features 544 are generally formed in a horizontal configuration.

Figure 5E:
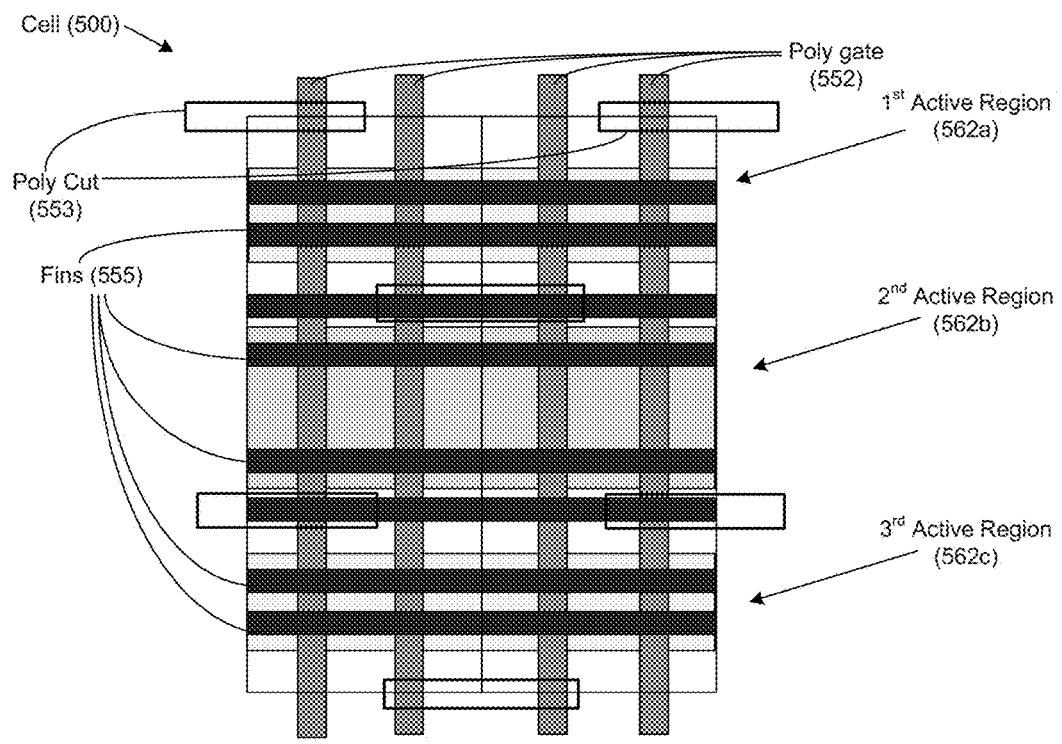
FIG. 5E illustrates a stylized depiction of the gate, fin, and active layers of the cell of FIG. 5A, in accordance with embodiments herein.

FIG. 5E illustrates a stylized depiction of the gate, fin, and active layers of the cell 500, in accordance with embodiments herein. The cell 500 comprises a $1^{st}$ active region 562a, a $2^{nd}$ active region 562b, and a $3^{rd}$ active region 562c. The $1^{st}$ and $3^{rd}$ active regions 562a, 562c may be NMOS regions and the $2^{nd}$ active region 562b is a PMOS region.

A plurality of source/drain fins 556 may be formed in the cell 500. A fin cut mask 554 may be used to selectively remove portions of fins 556 that are formed outside the active regions 562a, 562b, 562c.

A plurality of poly gate features 552 may be formed in the cell 500. A poly cut mask 553 may be used to selectively remove portion of some of the poly gates 552 outside the active regions 562a, 562b, 562c. The poly gate features 552 may be formed orthogonally relative to the fins 556. In this manner, unidirectional formation of metal features may be used to form device cells, such as memory cells that are compatible with standard cells that comprise similarly configured metal features. Therefore, certain metal lines (e.g., M2 metal lines) may be used as bit lines in memory cell, while similar M2 metal lines may be used as routing resources in standard cells that are placed alongside device cells.

The embodiments exemplified by FIGS. 5A-5E, provide for source/drain connections that comprise unidirectional metal connections. Embodiments herein also provide for an increased amount of edge placement tolerance. Embodiments herein provide for unidirectional metal features (e.g., horizontal unidirectional M2 lines) SADP compatible designs. Using embodiments herein, improved scalability may be achieved.

Figure 6A:
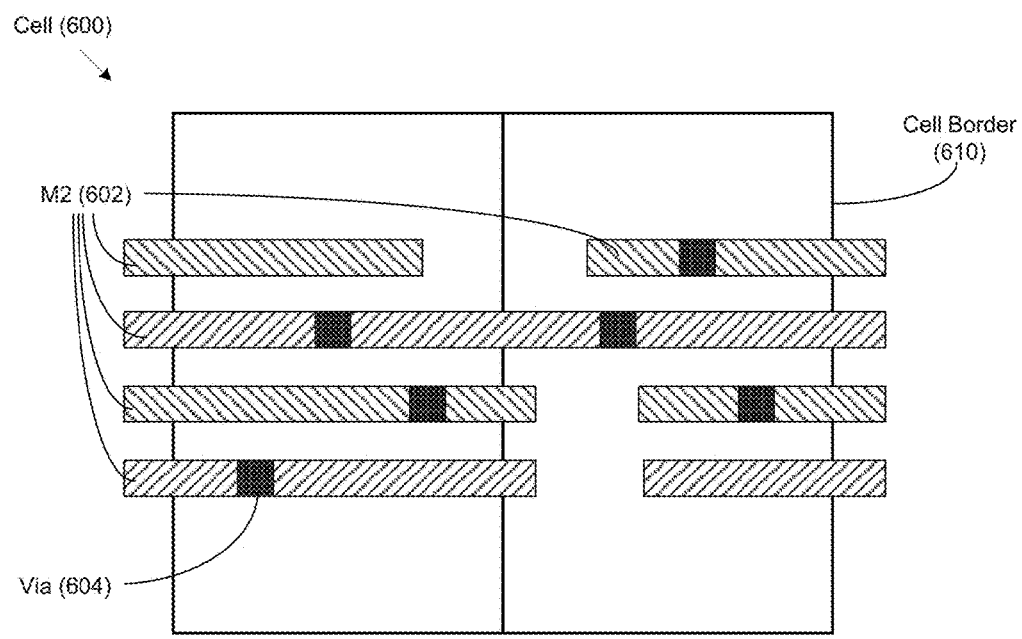
FIG. 6A illustrates a stylized depiction of an M2 layer of a cell, in accordance with embodiments herein.
Figure 6B:
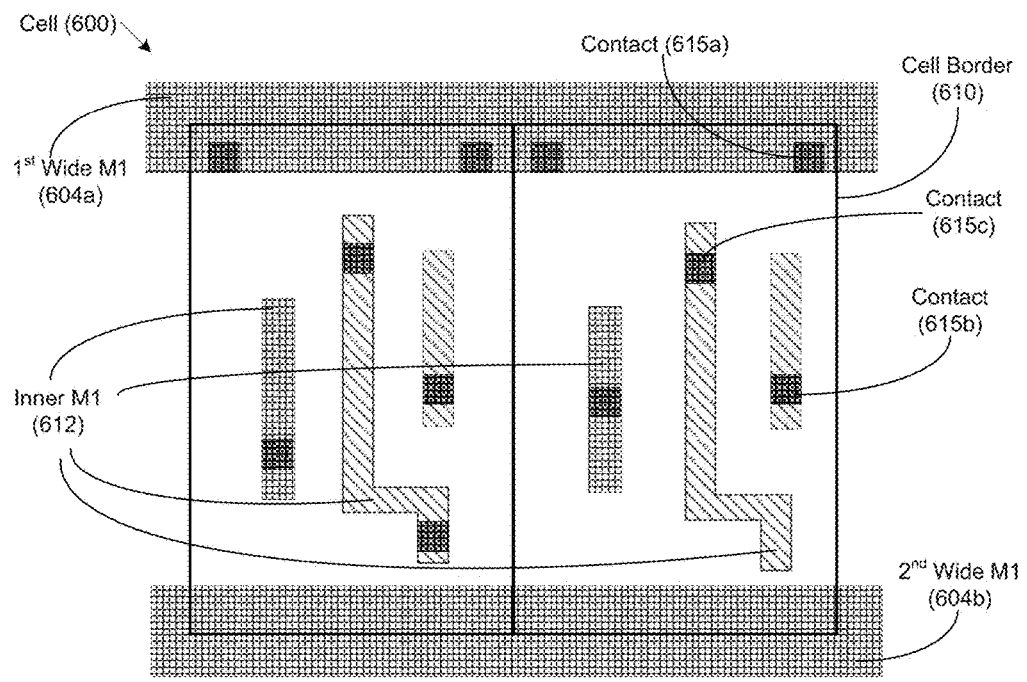
FIG. 6B illustrates a stylized depiction of an M1 layer of the cell of FIG. 6A, in accordance with embodiments herein.
Figure 6C:
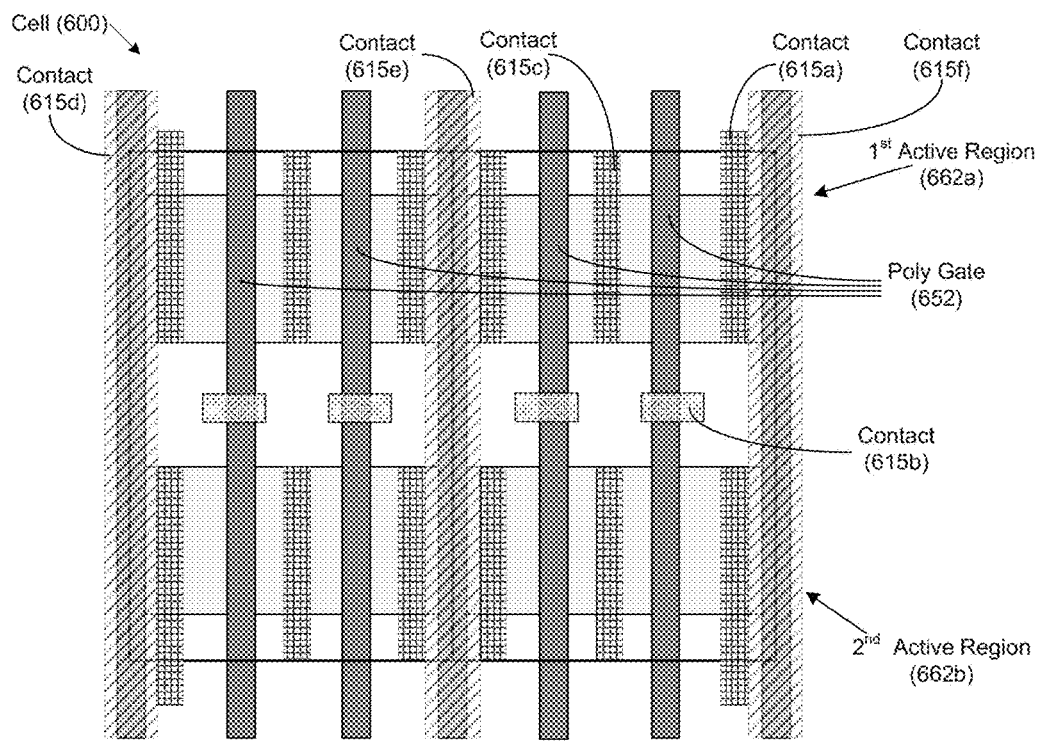
FIG. 6C illustrates a stylized depiction of the gate and layers of the cell of FIG. 6A, in accordance with embodiments herein.

Turning now to FIGS. 6A-6C, another stylized depiction of a plurality of layers of a cell of a semiconductor device, in accordance with embodiments herein is illustrated. In one embodiment, each of the FIGS. 6A-6C may represent the placement of two cells. FIG. 6A illustrates a stylized depiction of an M2 layer of the cell 600, in accordance with embodiments herein. The cell 600 may comprise a plurality of M2 layer metal features 602. A plurality of vias 604 may be placed in predetermined locations on the metal features 602 for providing connection to metal features on other layers. In one embodiment, the M2 metal features may be formed in a unidirectional, horizontal format. In some embodiments, the M2 metal lines 602 may be used as bit lines if the cell 600 is a bit cell. In other embodiments, the M2 metal lines 602 may be used as routing lines if the cell 600 is a standard cell. In one embodiment, the M2 metal structures 602 may be formed using an SAPD process.

Turning now to FIG. 6B, a stylized depiction of an M1 layer of the cell 600, in accordance with embodiments herein is illustrated. A plurality of M1 metal structures 612 may be formed. In one embodiment, a $1^{st}$ wide M1 structure 604a may be formed on the top of the cell border 610, and $2^{nd}$ M1 structure 604b may be formed on the bottom of the cell border 610. The Vss and Vdd signals of the cell 600 may be electrically coupled to the $1^{st}$ and $2^{nd}$ wide M1 structure, respectively.

A plurality of inner M1 formations 612 may be formed inside the cell border 610. In some embodiments, the inner M1 metal structures 612 may be formed in a vertical configuration. Other metal structures in other metal layers, or electrical signals from other layers, may be electrically coupled to M1 metal structures 532 using one or more local interconnects features. For example, the M1 metal feature 604a may comprise a plurality of contact regions, such as the contact feature 615a. The inner M1 metal features 612 may also comprise contact regions, such as contact features 615b, 615c. In one embodiment, the M1 metal structures 612 may be formed using a litho-etch-litho-etch-litho-etch (LELELE) process.

FIG. 6C illustrates a stylized depiction of the gate and layers of the cell 600, in accordance with embodiments herein. The cell 600 comprises a $1^{st}$ active region 662a and a $2^{nd}$ active region 562b. The $1^{st}$ active regions 662a may be an NMOS region and the $2^{nd}$ active region 662b may be a PMOS region.

A plurality of poly gate features 652 may be formed in the cell 600. Poly cut masks may be used to selectively remove portion of some of the poly gates 652 outside the active regions 562a and 562b. The poly gate features 652 may be formed orthogonally relative to the horizontal M2 metal features 602 (FIG. 6A).

Referring simultaneously to FIGS. 6B and 6C, a plurality of contact regions may be formed on the contact layer of the cell 600. For example, a contact region 615a (e.g., CA or CB contact feature) may be formed in the $1^{st}$ active region 662a, wherein the contact feature 615a in FIG. 6C corresponds to the contact feature 615a of FIG. 6B. A contact feature 615c may be formed in between the $1^{st}$ and $2^{nd}$ active regions 662a, 662b, wherein the contact feature 615b in FIG. 6C corresponds to the contact feature 615b of FIG. 6B. A contact region 615c may be formed in the $1^{st}$ active region 662a, wherein the contact feature 615c in FIG. 6C corresponds to the contact feature 615c of FIG. 6B. As shown in FIG. 6C, similar contact regions may be formed in the $2^{nd}$ active region 662b as well. Further, longitudinal contact regions (615d, 615e, 615f) may be formed on poly gates 652 that are formed on the cell borders.

The M2 metal lines 602 may be used as bit lines in a memory cell, while similar M2 metal lines may be used as routing resources in standard cells that are placed alongside device cells. The standard cell layout of FIGS. 6A-6C provide for compatibility with memory cells that comprise unidirectional metal lines.

Figure 7:
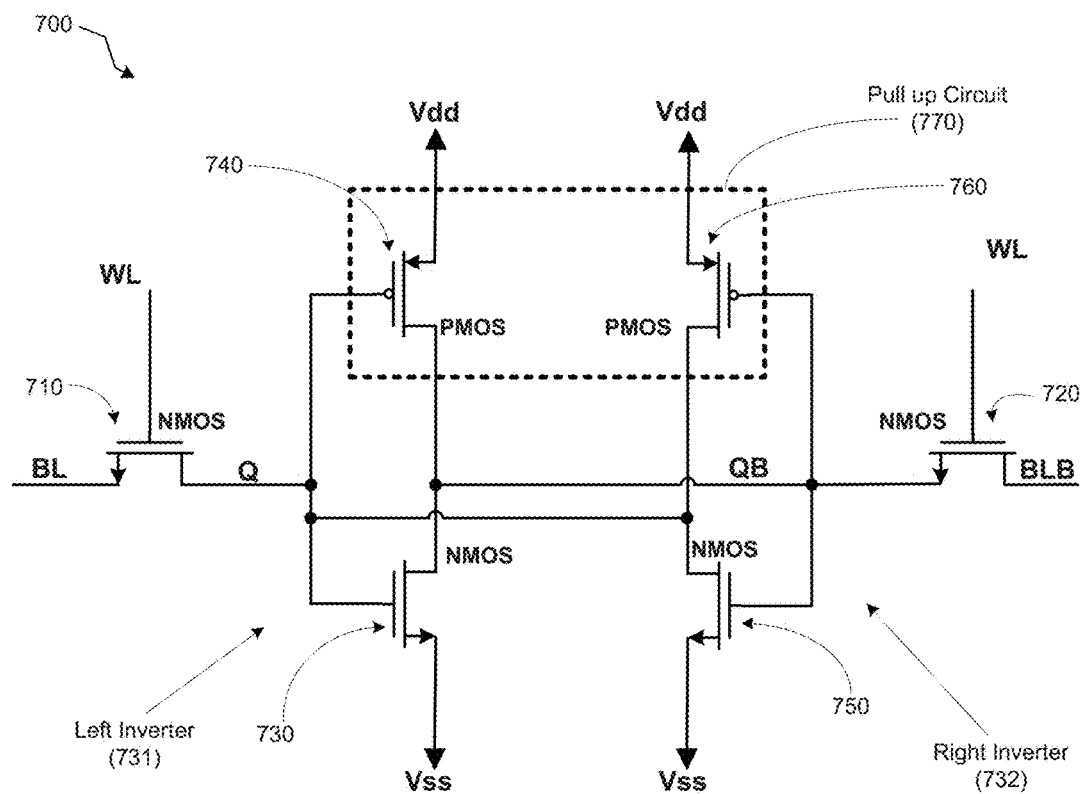
FIG. 7 illustrates a stylized depiction of an SRAM memory cell of FIG. 6A that may be formed using the layout techniques provided by embodiments herein.

FIG. 7 illustrates stylized depiction of an SRAM memory cell 700 that may be formed using the layout techniques provided by embodiments herein. SRAMs retain their stored data as long as they are supplied power. Unlike dynamic RAM (DRAM), which requires periodic "refresh" power cycles, SRAMs do not require refresh cycles. Further, SRAMs are in contrast to non-volatile memory (e.g., flash memory), which continue to hold information despite losing power. The random access term of SRAM refers to the fact that an SRAM comprises a plurality of cells, wherein each cell may be accessed (write or read access) in any order, regardless of which SRAM cell was last accessed.

The cell 700 is a six transistor (6T) device, which includes: two access transistors 710 and 720; and four transistors (730, 740, 750, 760), which form two inverters. Two pairs of transistors form two inverters: a left inverter 731 from the transistor pair 730, 740; and right inverter 751 from the transistor pair 750, 760. Each of the transistors in the cell 700 is a device formed from SAPD processes. The output of each inverter is fed as an input to the other inverter, providing a feedback loop that stabilizes the inverters to their respective states.

The access transistors 710, 720 are coupled to bit-lines (BL) and word lines (WL). The bit lines and word lines are used to read from, and write to, the cell 700. In a standby mode, the word line is low, turning the access transistors 710, 720 to an off state. When the access transistors 710, 720 in an off state, the left inverter 731 is in a complementary state. In order to write information, data to be written is provided onto the bit line, and the inverse of the data state is provided onto the inverse bit line BLB. The access transistors 710, 720 are then turned on by setting the word line, WL to a high state. The bit lines are driven stronger, and therefore, the inverter transistors become asserted. This operation causes data to be written into the cell 700. When data is stored into the inverters 731, 751, the access transistors can be turned off, preserving the information in the inverters 731, 751. In order to perform a read function, the word line, WL is turned on. This activates the access transistors 710, 720, while the data (bit) that is stored in the inverters 731, 751 is sensed.

The transistors 740, 760 can be viewed as a pull up circuit, denoted by the dashed lines 770. As shown in FIG. 7, the transistors 740, 760 in the box 770 are PMOS devices and are pulled up to Vdd. All other transistors in the cell 700 are NMOS transistors. The PMOS transistors 740, 760 function as resistive loads for the pull up circuit 770.

The transistors formed from the SADP processes described herein may be formed in a memory cell having unidirectional metal lines, wherein the metal lines are compatible with similar metal lines in a standard cell. Accordingly, memory devices having the memory cell described herein and a standard cell may be processed more efficiently and using less area, thereby providing for 10 nm node technology, 7 nm node technology, and/or for smaller-node technology.

Figure 8:
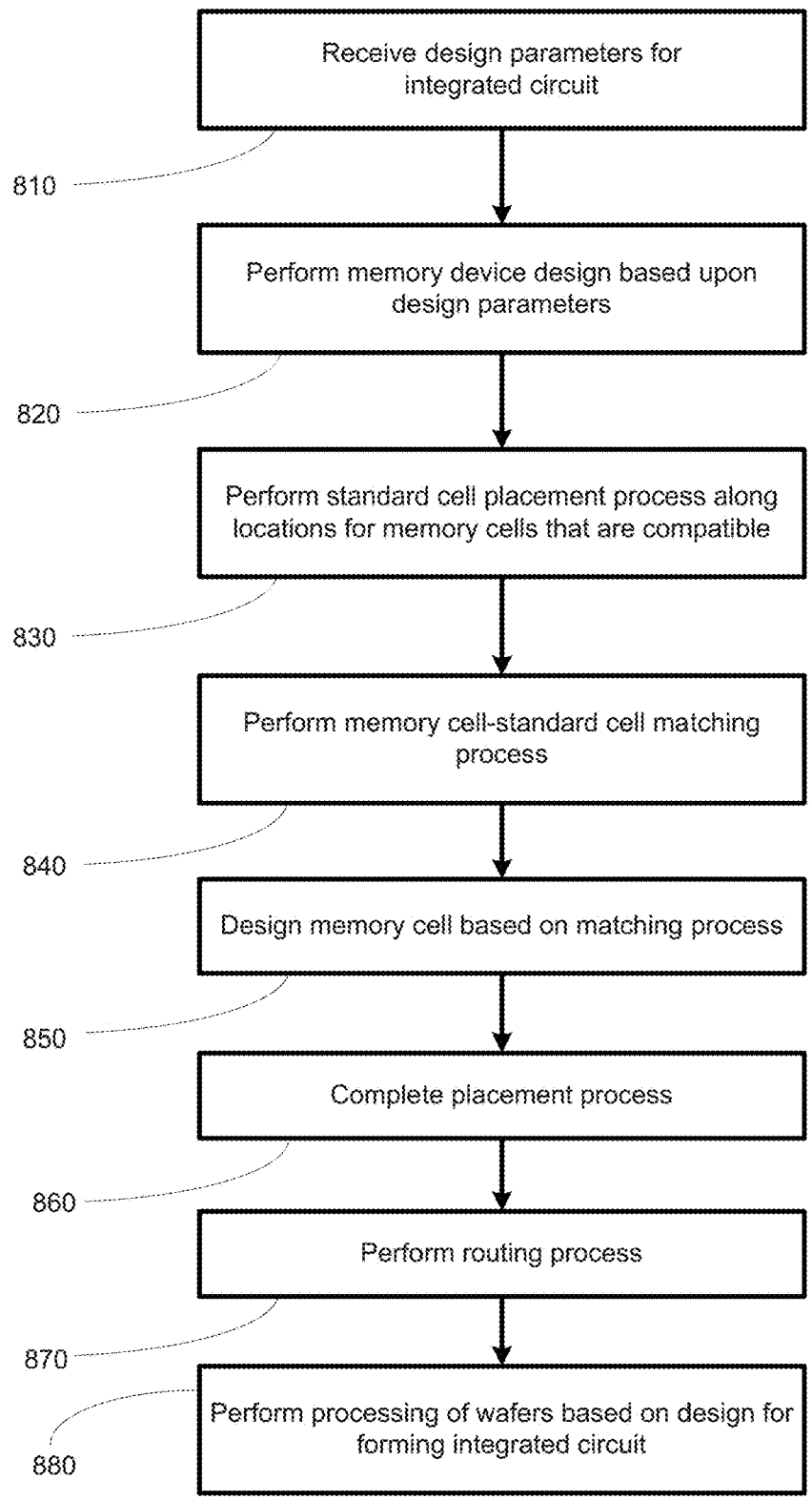
FIG. 8 illustrates a flowchart depiction of a method in accordance with embodiments herein.

Turning now to FIG. 8, a flowchart depiction of a method in accordance with embodiments herein, is illustrated. A set of design parameters for fabricating an integrated circuit (e.g., memory device) may be received (block 810). The design parameters may comprise various definitions for components (e.g., finFET devices) that are used to form memory cells, functional cells and/or cell combinations for fabricating an integrated circuit. Based upon the parameters, one or more memory cells and compatible functional cells may be provided (block 820).

In order to design the integrated circuit, a placement process may be performed (block 830). The placement process may include grouping a plurality standard functional cells along locations for memory cells that are compatible in the manner described above (i.e., similar unidirectional metal features, etc.). This may be preliminary placement process, which may be completed after the memory cells are received, selected or designed.

A memory cell matching process may be performed (block 840). This process includes determining the type of orientation for certain metal-layer features such that the memory cells and the functional cells are compatible. For example, the M2 metal features for both types of cells (the memory cells and the standard functional cells) may be formed in a unidirectional, horizontal configuration.

The memory cells may be designed, selected, or received based on the matching process (block 850). For example, the memory cells may be designed such that certain metal-layer features of the memory cells are matched with corresponding metal-layer features of standard cells. For example, the memory cell (e.g., SRAM bit cell) may be designed to comprise a plurality of metal layer structures (e.g., M2 metal structures) that are similar to unidirectional shaped structures of a standard cell. In some embodiments, these metal structures may be used as bit lines for the memory bit cell, while serving as horizontal routing lines for providing connections for standard cells. Further, in some embodiments, these metal structures may be formed in a perpendicular configuration relative to poly gates of the standard cell.

Upon design, selection, or acquisition of the memory cells, the placement of the memory cells and corresponding standard cells may be performed (block 850). This process may be performed manually or automatically by a design/placement software, hardware, and/or firmware module. Upon performing the placement process, a routing process may be performed (block 860). The routing process may include generating metal tracks, power rails, interconnection features, poly gate formations, metal bit lines, and metal routing lines. The routing process may be performed to route connections between the various components of the memory cells and the functional cells.

Once the placement and routing processes are complete, the processing of semiconductor wafers may be performed based upon the definitions of memory and functional cells (block 760). The process may provide integrated circuit devices (e.g., memory devices) that comprise devices (e.g., finFET devices) that have increased dense placement and routing of cell components. This may provide for integrated circuitry on wafers that have less process errors and are more dense, and therefore, provide for small and more powerful semiconductor devices.

Figure 9:
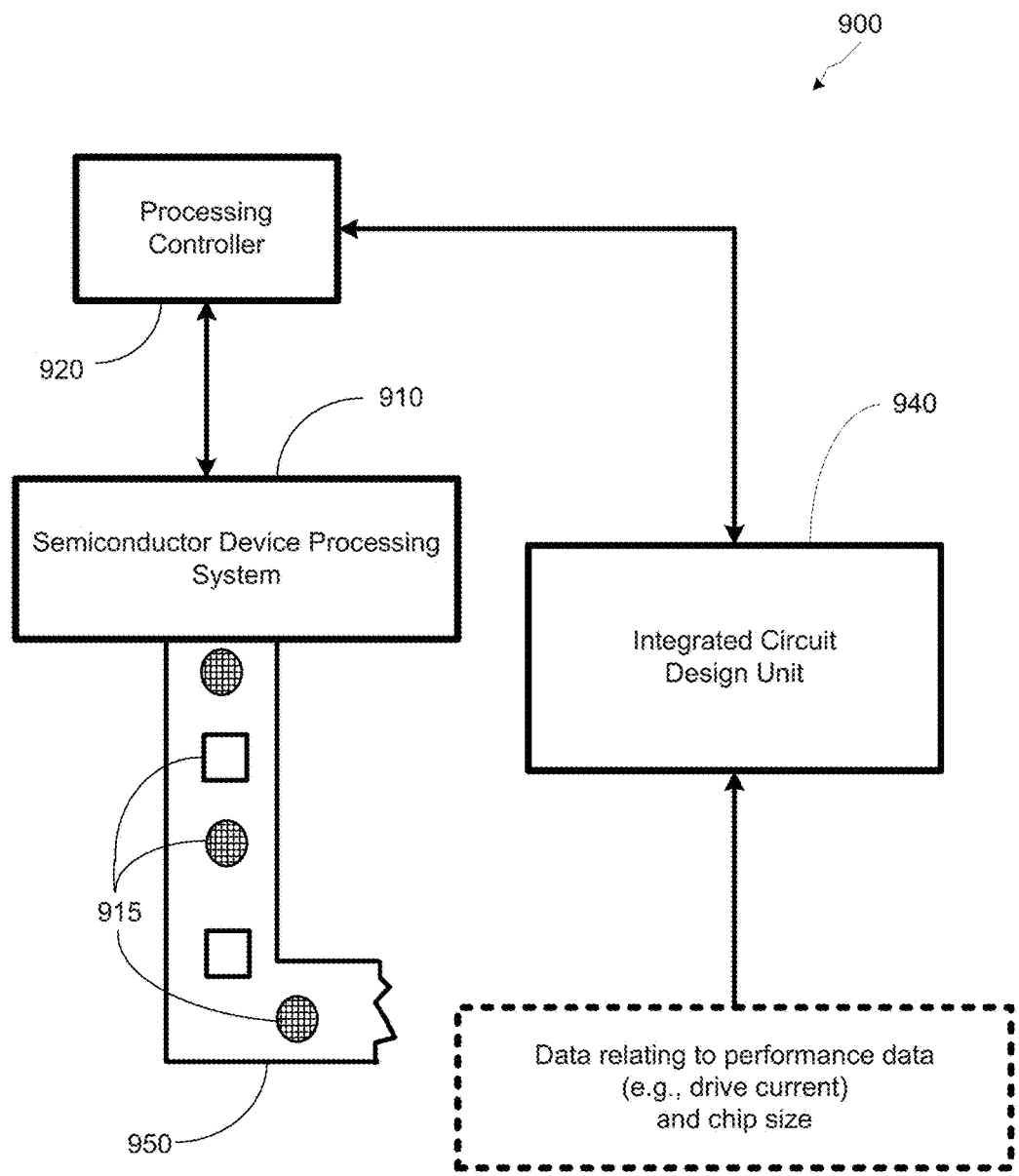
FIG. 9 illustrates a stylized depiction of a system for fabricating a device comprising unidirectional metal features, in accordance with some embodiments herein.

Turning now to FIG. 9, a stylized depiction of a system for fabricating a device comprising unidirectional metal features, in accordance with some embodiments herein, is illustrated. The semiconductor device processing system 910 may comprise various processing stations, such as etch process stations, photolithography process stations, CMP process stations, etc. One or more of the processing steps performed by the processing system 910 may be controlled by the processing controller 920. The processing controller 920 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 910 may produce integrated circuits on a medium, such as silicon wafers. The production of integrated circuits by the device processing system 910 may be based upon the circuit designs provided by the integrated circuit design unit 940. The processing system 910 may provide processed integrated circuits/devices 915 on a transport mechanism 950, such as a conveyor system. In some embodiments, the conveyor system may be sophisticated clean room transport systems that are capable of transporting semiconductor wafers. In one embodiment, the semiconductor device processing system 910 may comprise a plurality of processing steps, e.g., the 1$^{st}$ process step, the 2$^{nd}$ process set, etc., as described above.

In some embodiments, the items labeled "915" may represent individual wafers, and in other embodiments, the items 915 may represent a group of semiconductor wafers, e.g., a "lot" of semiconductor wafers. The integrated circuit or device 915 may be a transistor, a capacitor, a resistor, a memory cell, a processor, and/or the like. In one embodiment, the device 915 is a transistor and the dielectric layer is a gate insulation layer for the transistor.

The integrated circuit design unit 940 of the system 900 is capable of providing a circuit design that may be manufactured by the semiconductor processing system 910. The design unit 940 may receive data relating to the functional cells to utilize, as well as the design specifications for the integrated circuits to be designed. In one embodiment, the integrated circuit design unit 940 may provide memory cell and functional cell designs that comprise horizontal M2 unidirectional formations, vertical M1 and M3 unidirectional formations, CA, CB, and TS formations.

In other embodiments, the integrated circuit design unit 940 may perform an automated determination of routing compatibility of memory and functional cells and automatically select a functional cell that is compatible with the unidirectional metal designs of a memory cell. For example, once a designer or a user of the integrated circuit design unit 940 generates a design using a graphical user interface to communicate with the integrated circuit design unit 940, the unit 940 may perform automated selection of a functional cell that is compatible with the unidirectional metal designs of a memory cell. In other embodiments, the integrated circuit design unit 940 may be capable of automatically generating one or more standard functional cells that comprise horizontal M2 unidirectional formations, such that the memory cells may use M2 formations for bit lines, which the standard cells may use similar horizontal M2 lines for routing purposes. The design unit 940 may automatically select certain types of memory cell or standard cells from one or more such cells from a library based on compatibility.

The system 900 may be capable of performing analysis and manufacturing of various products involving various technologies. For example, the system 900 may use design and production data for manufacturing devices of CMOS technology, Flash technology, BiCMOS technology, power devices, memory devices (e.g., DRAM devices), NAND memory devices, and/or various other semiconductor technologies.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A method, comprising:
forming a first set of metal features extending in a first lateral direction in a first metal layer of a memory cell;
forming a second set of metal features extending in a second lateral direction perpendicular to the first lateral direction in a second metal layer of said memory cell;
forming a third set of metal features extending in the second lateral direction in a second metal layer of a functional cell for providing routing compatibility between said memory cell and said functional cell; and
placing said memory cell adjacent to said functional cell for forming an integrated circuit device.

2. The method of claim 1, wherein forming a second set of metal features comprises forming said second set of metal features as bit lines for said memory cell.

3. The method of claim 1, wherein forming a third set of metal features in said functional cell comprises forming said third set of metal features as metal routing lines.

4. The method of claim 1, wherein said second and third metal features are of similar rectangular characteristics.

5. The method of claim 1, wherein forming said first, second, and third sets of metal features comprises forming said first set of metal features using a litho-etch-litho-etch-litho-etch (LELELE) process, and forming said second and third sets of metal features using self-aligned double patterning (SADP) processes.

6. The method of claim 5, wherein using said SADP processes comprises using at least one of a 10 nm node spacing SADP process, and a 7 nm node spacing SADP process.

7. The method of claim 1, wherein:
forming said first set of metal features comprises forming said first set of metal features in a metal-1 (M1) metal layer of said memory cell;
forming said second set of metal features comprises forming said second set of metal features in a metal-2 (M2) metal layer of said memory cell; and
forming said third set of metal features comprises forming said third set of metal features in an M2 metal layer of said functional cell.

8. The method of claim 1, further comprises forming a plurality of poly gate features in said memory cell and in said functional cell, wherein said poly gate features extend in said first lateral direction.

9. The method of claim 8, wherein forming a plurality of poly gate features comprises using a plurality of poly cut processes.

10. The method of claim 1, further comprising forming a plurality of vias for electrically coupling a portion of said set of first metal features to a portion of said second metal features.

11. The method of claim 1, further comprising forming a plurality of source fins and a plurality of drain fins in a plurality of active regions of said memory cell and said functional cell.

12. The method of claim 1, wherein forming a plurality of source fins and drain fins comprises using a plurality of fin cut processes to form said fins within said active areas.

13. The method of claim 1, further comprising forming a plurality of local interconnect features, wherein said local interconnect features comprises at least one of a trench silicide (TS) feature, a CA feature, and a CB feature.

14. A system, comprising:
a semiconductor device processing system for fabricating an integrated circuit device based upon a design comprising a functional cell; and
a processing controller operatively coupled to said semiconductor device processing system, said processing controller configured control an operation of said semiconductor device processing system adapted to:
form a first set of metal features extending in a first lateral direction in a first metal layer of a memory cell;
form a second set of metal features extending in a second lateral direction perpendicular to the first lateral direction in a second metal layer of said memory cell;
form a third set of metal features extending in the second lateral direction in a second metal layer of a functional cell for providing routing compatibility between said memory cell and said functional cell; and
place said memory cell adjacent to said functional cell for forming an integrated circuit device.

15. The system of claim 8, further comprising a design unit adapted to receive a design for an integrated circuit device, wherein said design comprises a plurality of parameters for said memory cell and for said functional cell.

16. The system of claim 14, wherein said processing controller is further adapted to:
form said second set of metal features in a metal-2 (M2) metal layer of said memory cell;
form said third set of metal features in an M2 metal layer of said functional cell;
form a plurality of source fins and a plurality of drain fins in a plurality of active regions of said memory cell and said functional cell;
form a plurality of local interconnect features, wherein said local interconnect features comprise at least one of a trench silicide (TS) feature, a CA feature, and a CB feature.

* * * * *